Dec. 8, 1970 R. E. FREDRICK ET AL 3,546,025

THERMOELECTRIC GENERATOR APPARATUS

Filed April 14, 1966

INVENTORS
RUSSELL E. FREDRICK
THOMAS L. NYSTROM
BY Carpenter, Kinney & Coulter
ATTORNEYS United States Patent Office 3,546,025
Patented Dec. 8, 1970

3,546,025
THERMOELECTRIC GENERATOR APPARATUS

Russell E. Fredrick, White Bear Lake, and Thomas L. Nystrom, St. Paul Park, Minn., assignors to Minnesota Mining and Manufacturing Company, a corporation of Delaware Filed Apr. 14, 1966, Ser. No. 542,636
Int. Cl. H01v *1/06*
U.S. Cl. 136—205 3 Claims

ABSTRACT OF THE DISCLOSURE

Thermoelectric generator apparatus in which the thermoelectric legs are electrically connected to at least one of their electrodes by pressure-contact apparatus. A thin layer of electrically conductive, non-deleterious, plastically deformable material is disposed between the leg and the electrode against which the leg is biased to increase the area of contact between the leg and the electrode.

This invention relates to thermoelectric generators and more specifically to thermoelectric legs adapted for low-resistance pressure contact with an electrode member in a thermoelectric generator.

Incorporation of a thermoelectric leg in the electrical and thermal circuitry of a thermoelectric generator by pressure contact connection apparatus has been found to avoid the deterioration which results under high temperature operation to a thermoelectric leg incorporated in a generator by metallurgical bonding to an electrode member at each end of the leg. Typically, in such a pressure contact connection apparatus the cold junction end of the leg is metallurgically bonded to its electrode member, while the hot junction end is forced into contact with its electrode member by spring pressure acting through the cold junction electrode.

Though such a pressure contact connection apparatus avoids deterioration of the leg, it does not always provide connections of predictable, low electrical resistance. More specifically, it has been found that some thermoelectrically useful materials and the generally used electrode materials are so mechanically intractable that thermoelectric legs and electrode members made from them do not fully or intimately contact one another under the contact pressure exerted by the connection apparatus. For example, irregularities in the end surface of the leg or in the electrode contact surface due to machining marks or molding or casting imperfections, lack of right-angularity of the transverse end of the leg, and misalignment of the leg in the generator all result in poor mating of the end of the leg and electrode member. In addition, thermal expansion of generator components may introduce a slight spacing over a large enough area of the contacting surfaces to substantially increase electrical resistance.

By this invention, thermoelectric legs which have a plastically deformable end portion are provided whereby intimate contact is achieved between the leg and its electrode member. As a result, the electrical resistance of pressure contact connections with the new legs are quite low, and much lower than pressure contact connections in previous generators incorporating prior art thermoelectric legs of the same thermoelectric material. The resistance at each pressure contact is lower with the new legs by as much as 0.010 ohm or more, and since this reduction can amount to 80 percent of the whole electrical resistance of a generator circuit, the efficiency of generators incorporating thermoelectric legs of this invention is significantly increased.

In general, a thermoelectric leg of this invention comprises, first of all, a main body portion of material having useful thermoelectric conversion properties. To at least one end surface of this main body portion, a thin layer of material different from the material of the main body portion is intimately attached. This material (a) is plastically deformable at the temperature of generator operation under a useful longitudinal contact pressure on the leg whereby the surface of the layer conforms to a substantially smooth mating surface;
(b) is a good electrical conductor; and
(c) is free of material that would be migratable to the main body portion in amounts effective to significantly reduce the thermoelectric conversion properties of the material of the main body portion.

Under the heat and pressure of thermoelectric generator operation, the plastically deformable layer provides conformation to the surface of the electrode.

Figure 1:
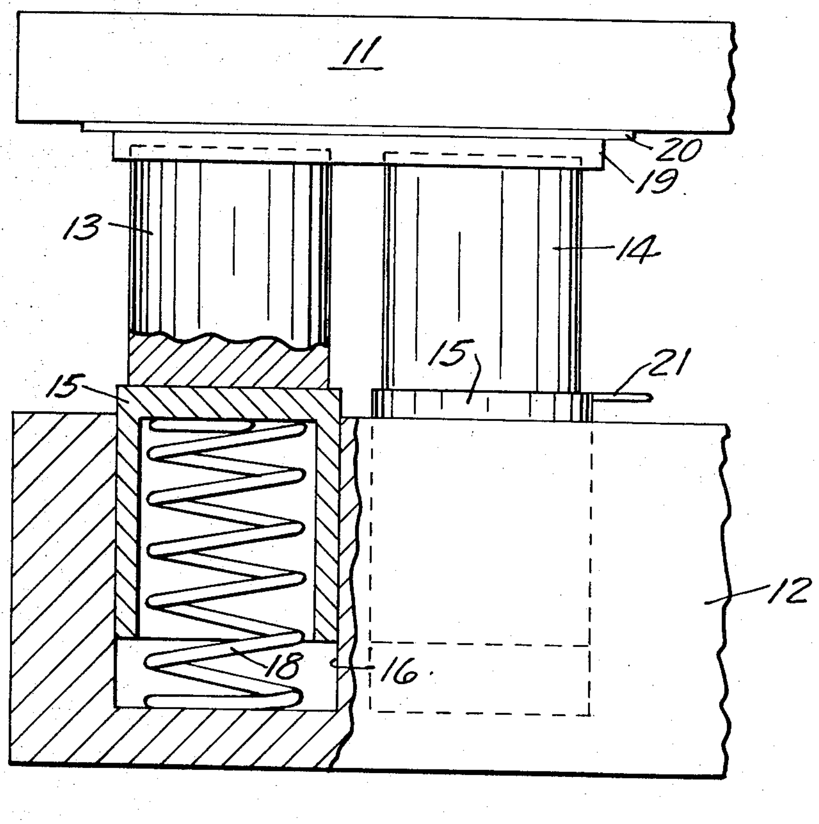
FIG. 1 is an elevation, partly in section, of a portion of a subassembly of a thermoelectric generator incorporating a thermoelectric leg of this invention.

The subassembly of a thermoelectric generator shown in FIG. 1 includes a heat absorbing member 11 typically of stainless steel, and a heat dissipating member 12, typically of a highly thermally conductive material such as aluminum. In a generator, a source of heat such as a gas burner impinges on the heat absorbing member 11 while heat dissipating apparatus such as a plurality of fins is incorporated with the heat dissipating member 12.

Two thermoelectric legs are shown interposed between the heat absorbing and dissipating members, one leg, 13, being a P-type leg of this invention, and the other, 14, being an N-type leg of conventional structure. The legs 13 and 14 are metallurgically bonded to cold junction electrodes 15 which slide loosely in bores 16 in the heat dissipating member 12. The cold junction electrodes are acted upon by springs 18 to bias the legs 13 and 14 against an electrode member 19. The electrode member is separated from the heat absorbing member 11 by a thin layer 20 of a material such as mica that thermally connects the electrode member to, but electrically insulates it from, the member 11. An electric circuit with the legs of the generator in series is completed by short wires 21 attached to those adjoining cold function electrodes 15 that support legs not already electrically connected by an electrode member 19.

Figure 2:
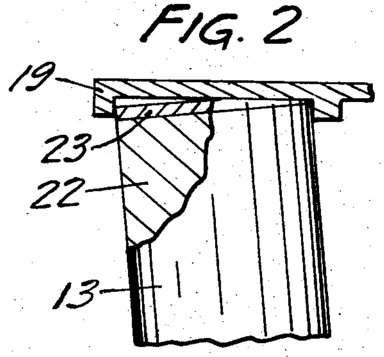
FIG. 2 is a partial elevation, partly in section of an initial position of a thermoelectric leg of this invention biased against an electrode member.

FIG. 2 shows in an exaggerated fashion one possible original position of a thermoelectric leg of this invention 13 biased against an electrode member 19. The leg 13 includes the previously noted main body portion 22 and thin layer 23 of plastically deformable, electrically conductive material. In the somewhat misaligned position of the leg illustrated, the transverse end of the leg does not fully contact the electrode member surface. Gaps as large as 0.1 mil may occur even with carefully dimensioned parts due to the illustrated misalignment or other factors such as thermal expansion. Also, as previously discussed, the contacting surfaces of the electrode member and thermoelectric leg, though substantially smooth, will in practice often have surface irregularities due to machining marks, molding or casting imperfections, etc. that prevent full contact.

Figure 3:
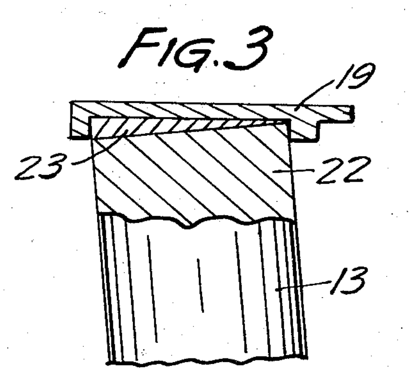
FIG. 3 is a partial elevation, partly in section, of a second position of the parts shown in FIG. 3.

FIG. 3 illustrates the thermoelectric leg illustrated in FIG. 2 and its relationship to the electrode member after a period of high temperature operation. Under the influence of heat and pressure, the plastically deformable layer 23, has deformed until a substantial portion of the surface of it lies in close contact with the surface of the electrode member 19. While FIGS. 2 and 3 illustrate the functioning of the thin layer of the thermoelectric leg of this device to remove a gap due to misalignment of the parts, the thin layer similarily functions to remove gaps between the end of the leg and electrode member due to other causes.

The invention is further illustrated in the following example.

EXAMPLE

Cylindrical thermoelectric legs, .75 centimeter long and 0.96 centimeter in diameter, were formed with a main body portion and a thin layer intimately attached to it at one transverse end. The main body portion was formed from an alloy composition comprising 95 mol percent of a mixture that included lead telluride and tin telluride in even parts and 5 mol percent of manganese telluride; sodium in an amount equal to two atomic percent of the above ingredients was also present in the alloy composition. The thin layer was formed from an alloy composition that included a mixture of lead telluride and tin telluride in even parts and sodium in an amount equal to two atomic percent of the lead and tin tellurides. The legs were formed in a press from powder ground from castings including the appropriate elements. The material for the plastically deformable thin layer was first added to the press in an amount sufficient to provide a 10 mil layer (.012 gram) and the material shaken out in an even thickness over the bottom of the press cavity. Next about 3.5 grams of the material for the main body portion of the legs was added, and the press plunger then applied at 60,000 pounds per square inch for about 2 seconds. The resulting ingots were sintered at about 1450° F. for 1 hour while mixed in graphite powder and enclosed in a reducing atmosphere.

Thermoelectric legs thus prepared were incorporated in thermoelectric generators with the leg soldered to a cold junction electrode of nickel-plated copper as illustrated in FIG. 1 and pressed against an electrode member of iron with 150 pounds per square inch of pressure. When operated over a period of time at about 1200° F. it was found that on the average the electrical resistance at each hot junction connection was about 0.0001 ohm. This compares with an average electrical resistance per hot junction connection of about 0.006 ohm often found in a thermoelectric generator incorporating pressure-contacted thermoelectric legs that are wholly of the material of the main body portion of the thermoelectric legs of this example.

The above example illustrates that the elimination of manganese from the material of the main body portion of the thermoelectric leg substantially increases the ductility of the material. The thermoelectric legs of this invention that also illustrate this principle include legs in which the main body portion is lead, germanium, and tellurium and the thin layer is lead telluride and legs in which the main body portion is silver, antimony, and tellurium and the thin layer is antimony telluride. In all these cases the elimination of one element from a material that is useful as the main body portion of a thermoelectric leg provides a plastically deformable material useful in pressure contacting an electrode member.

Another example of a useful material for the thin layer of a thermoelectric leg of this invention is material having an excess of one of its components as a separate phase. For example, with a thermoelectric leg made of lead, germanium, and tellurium the addition of either lead or tellurium in excess of the amount stoichiometrically required provides a satisfactory material for use as a plastically deformable thin layer of a thermoelectric leg of this invention. It is theorized that the excess element present as a second phase softens at the high temperature of generator operation and forms a matrix in which the crystallites of combined lead, germanium, and tellurium shift and assume the desired position against the electrode member.

It is preferred that the material of the thin layer include only elements that are in the main body portion of the leg. Generally, such a similarity in material will avoid significant reduction of the thermoelectric conversion properties of the material in the body portion. In some cases as in the silver antimony tellurium leg described above the material of the thin layer does not migrate into the main body portion of the leg. In other cases, the migrating elements do not significantly alter the thermoelectric conversion properties.

The desired thickness of the thin layer varies somewhat with the materials involved. In general, the layers should be thick enough to fill in gaps due to surface irregularities and misalignment and to fill in gaps accompanying thermal expansion of the generator parts. On the other hand, the layers should not be so thick as to provide an abundance of material that might alter the thermoelectric conversion properties of the leg. Nor should the thin layer occupy a large length of the thermal gradient impressed on the leg. In general, it has been found that a layer on the order of 10 mils in thickness, that is, up to about 100 mils in thickness, provides satisfactory results for this invention.

In practice, a thin layer of any non-deleterious, electrically conductive material that exhibits a significant superiority in plastic deformability over an intractable material being used as the main body portion of a thermoelectric leg, will provide a better pressure contact. A typical useful contact pressure employed in pressure contact connection apparatus is less than 250 pounds per square inch, and preferably is around 150 pounds per square inch. In general, with such contact pressures it will be difficult to pressure contact a thermoelectric leg that comprises a material having a Brinell hardness at the temperature of generator operation much greater than about two. Similarly, to be useful as the plastically deformable thin layer of a thermoelectric leg of this invention, a material should have a Brinell hardness that is not much greater than about two at the temperature of generator operation. The needed plastic deformability will vary with the material involved, the temperature of operation, the longitudinal contact pressure applied on the leg, and the particular connection apparatus involved.

The more electrically conductive the material of the thin layer, the better will be the results. In general, the material of the thin layer should not have an electrical resistivity greater than 0.001 ohm-centimeter. For best results, the material of the thin layer should also have a thermal coefficient of expansion similar to that of the material of the main body portion. Such a similarity avoids creation of stresses within the end of the leg that might otherwise accompany the high temperature of operation of the leg.

The most convenient procedure for attaching a thin layer of plastically deformable material to the end of a thermo electric leg is by the described procedure of pressing powdered material. On the other hand, useful thermoelectric legs of this invention are provided by welding the thin plastically deformable layer to the end of the main body portion of the leg. While the thermoelectric leg illustrated is a cylinder having a transverse end at right angles to the axis of the cylinder, other configurations are also contemplated and useful thermoelectric legs of this invention could be provided with other end configurations adapted to mate with similarly configured electrode members. Further, though the invention is described with reference to hot junction pressure contacts, cold junction pressure contacts also are useful and application of a thin plastically deformable layer to the cold junction end of a thermoelectric leg is contemplated within this invention.

We claim:

1. A thermoelectric generator comprising (1) an array of thermoelectric legs that each comprise a body of thermoelectric material having useful thermoelectric conversion properties and that are each disposed between one hot-junction electrode and one cold-junction electrode, which electrodes are arranged to electrically connect adjacent legs, (2) pressure means acting on at least one leg and on that leg's hot-junction and cold-junction electrodes to place said leg and electrodes under compressive stress, and (3) a thin layer of material different from said thermoelectric material disposed between and in contact with the body of thermoelectric material of said leg and at least one of the electrodes toward which the leg is pressed, the thin layer only abutting the electrode in frictional engagement and being readily separable as a unit from the electrode, and the material of the thin layer being (a) plastically deformable at temperatures of generator operation under a useful longitudinal contact pressure on the leg whereby the surface of the layer in contact with the electrode conforms to the mating surface of the electrode;
(b) a good electrical conductor; and
(c) free of material that would be migratable to the body of thermoelectric material in amounts effective to significantly reduce the thermoelectric conversion properties of said thermoelectric material.

2. A thermoelectric generator of claim 1 in which the material of the thin layer includes only elements present in the body of thermoelectric material.

3. A thermoelectric generator of claim 2 in which said thermoelectric material is an alloy composition consisting essentially of lead, tin, manganese, and tellurium, and the material of the thin layer is an alloy composition consisting essentially of lead, tin and tellurium.

References Cited

UNITED STATES PATENTS

| | | | |
|---|---|---|---|
| 2,811,440 | 10/1957 | Fritts et al. | 136—238X |
| 3,075,030 | 1/1963 | Elm et al. | 136—202UX |
| 3,075,031 | 1/1963 | Hockings et al. | 136—238 |
| 3,208,877 | 9/1965 | Merry | 136—212X |
| 3,232,719 | 2/1966 | Ritchie | 136—201X |

ALLEN B. CURTIS, Primary Examiner

U.S. Cl. X.R.

136—237